United States Patent
Gruber et al.

(10) Patent No.: US 11,171,663 B2
(45) Date of Patent: *Nov. 9, 2021

(54) DIGITAL-TO-ANALOG CONVERTER

(71) Applicant: Intel Corporation, Santa Clara, CA (US)

(72) Inventors: Daniel Gruber, St. Andrae (AT); Ramon Sanchez, Galapagar (ES); Kameran Azadet, San Ramon, CA (US); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/833,729

(22) Filed: Mar. 30, 2020

(65) Prior Publication Data
US 2020/0366310 A1    Nov. 19, 2020

Related U.S. Application Data

(63) Continuation of application No. 16/369,262, filed on Mar. 29, 2019, now Pat. No. 10,608,661.

(51) Int. Cl.
| | |
|---|---|
| *H03M 1/66* | (2006.01) |
| *H01P 5/10* | (2006.01) |
| *H04B 1/04* | (2006.01) |
| *H01F 19/04* | (2006.01) |
| *H03H 7/38* | (2006.01) |
| *H03H 7/42* | (2006.01) |

(52) U.S. Cl.
CPC .............. *H03M 1/66* (2013.01); *H01F 19/04* (2013.01); *H01P 5/10* (2013.01); *H03H 7/38* (2013.01); *H03H 7/42* (2013.01); *H04B 1/04* (2013.01)

(58) Field of Classification Search
CPC . H03M 1/66; H01F 19/04; H01P 5/10; H03H 7/38; H03H 7/42; H04B 1/04
See application file for complete search history.

(56) References Cited

U.S. PATENT DOCUMENTS

| | | | | |
|---|---|---|---|---|
| 5,049,836 A | * | 9/1991 | Christie | H03F 3/211 330/277 |
| 5,600,321 A | * | 2/1997 | Wincn | H03M 1/0682 341/135 |

(Continued)

*Primary Examiner* — Nguyen T Vo
(74) *Attorney, Agent, or Firm* — 2SPL Patent Attorneys PartG mbB; Kieran O'Leary

(57) ABSTRACT

A digital-to-analog converter is provided. The digital-to-analog converter includes a first plurality of digital-to-analog converter cells configured to generate a first analog signal. Further, digital-to-analog converter includes a second plurality of digital-to-analog converter cells configured to generate a second analog signal. The first analog signal and the second analog signal form a differential signal pair. Further, the digital-to-analog converter includes a transmission line transformer comprising a first input node coupled to the first plurality of digital-to-analog converter cells, a second input node coupled to the second plurality of digital-to-analog converter cells, and a first output node. The transmission line transformer is configured to present a first impedance at the first and second input nodes and to present a second impedance at the first output node.

14 Claims, 6 Drawing Sheets

(56) References Cited

U.S. PATENT DOCUMENTS

| | | |
|---|---|---|
| 8,674,867 B1 | 3/2014 | Klepser et al. |
| 10,608,661 B1* | 3/2020 | Gruber .................. H03M 1/806 |
| 2010/0102885 A1* | 4/2010 | Heston .................... H03F 1/565 |
| | | 330/277 |
| 2014/0184339 A1 | 7/2014 | Gomez et al. |
| 2014/0269976 A1 | 9/2014 | Klepser et al. |

* cited by examiner

DIGITAL-TO-ANALOG CONVERTER

CROSS-REFERENCE TO RELATED APPLICATION

This application is a continuation of U.S. application Ser. No. 16/369,262, filed on Mar. 29, 2019. The contents of the earlier filed application is incorporated by reference herein in its entirety.

FIELD

The present disclosure relates to digital-to-analog conversion. In particular, examples relate to a Digital-to-Analog Converter (DAC), a transmitter, a base station and a mobile device.

BACKGROUND

A DAC such as a Capacitive DAC (CDAC) demands for a constant load impedance at its output over the instantaneous output bandwidth, i.e. the frequency range within which the output signal can be synthesized. Moreover, the load impedance presented to the DAC (e.g. a CDAC) should have a low value for optimum power transfer. For example, for a differentially implemented DAC, a full-scale single tone output power at the load may be calculated as follows:

$$P_{OUT} = \frac{V_{SUPPLY}^2}{2 \cdot R_L} \quad (1)$$

$P_{OUT}$ denotes the maximum single-tone output power (obtained with a full-scale sine wave) that is delivered by the DAC to a load exhibiting an impedance $R_L$. $V_{SUPPLY}$ denotes the supply voltage of the DAC.

For a more complex output signal of the DAC (e.g. a broadband signal characterized by a Peak-to-Average-Ratio, PAR, of more than two), the output power at the load may be calculated as follows:

$$P_{OUT} = \frac{1}{PAR^2} \cdot \frac{V_{SUPPLY}^2}{R_L} \quad (2)$$

The PAR of DAC output signal x may be defined as follows:

$$PAR(x) = \frac{x_{PEAK}}{x_{RMS}} \quad (3)$$

$x_{PEAK}$ denotes the maximum value of the DAC output signal x, whereas $x_{RMS}$ denotes the Root Mean Square (RMS) value of the DAC output signal x.

It can be seen from mathematical expressions (1) and (2) that the maximum DAC output power increases for decreasing load impedances $R_L$ coupled to the output of the DAC. Further, it can be seen that the load impedances should be lowered for a lower supply voltage in order to maintain a given output power level.

For example, a CDAC is inherently a pure AC DAC with a very low output impedance at Radio Frequency (RF) frequencies (when looking back from the load into the CDAC) since the series capacitors in the CDAC cells block DC currents. As described above in connection with mathematical expressions (1) and (2), the CDAC output power may be maximized by minimizing the load impedance directly connected to the CDAC. However, typically a predefined output impedance such as 100Ω (Ohm) is desired at the output of the CDAC in order to facilitate the interfacing with standard RF components (e.g. a filter, a mixer, a power amplifier or an antenna) of the transmit chain.

Hence, there may be a desire for an improved DAC architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
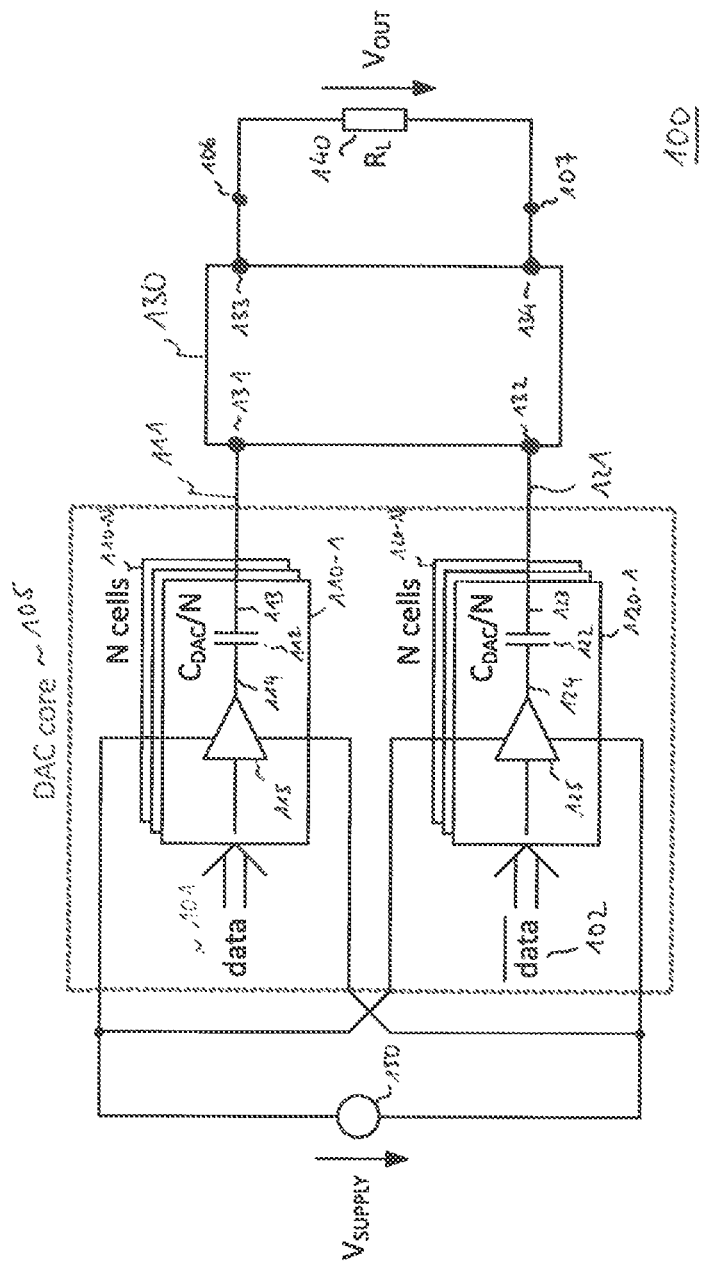
FIG. 1 illustrates a first example of a DAC.

FIG. 1 illustrates an example of a DAC 100 that may allow to maximize the DAC output power delivered to an external load and to prevent stability problems of active RF components interfacing with the DAC output (e.g. a mixer or a RF power amplifier).

The DAC 100 comprises a first plurality of DAC cells 110-1, . . . , 110-N configured to generate a first analog signal 111. Further, the DAC 100 comprises a second plurality of DAC cells 120-1, . . . , 120-N configured to generate a second analog signal 121. The first plurality of DAC cells 110-1, . . . , 110-N as well as the DAC cells 120-1, . . . , 120-N may be any number N≥2 of DAC cells, respectively (e.g. related to a desired resolution of the DAC). The first analog signal 111 and the second analog signal 121 form a differential signal pair. In other words, the DAC 100 is implemented as a differential DAC.

For illustrative purposes only, the DAC cells 110-1 and 120-1 are illustrated in detail. The DAC cells 110-1 and 120-1 may be understood to be exemplary for one or more other DAC cells of the first plurality of DAC cells 110-1, . . . , 110-N and the second plurality of DAC cells 120-1, . . . , 120-N. Although the proposed DAC architecture is described below with respect to the plurality of first DAC cells 110-1, . . . , 110-N and the second plurality of DAC cells 120-1, . . . , 120-N, it is to be noted that the proposed DAC architecture may as well be used for a DAC comprising only one first DAC cell and only one second DAC cell.

The DAC cells 110-1 and 120-1 comprise respective capacitive elements 112, 122 configured to generate respective analog cell output signals 113, 123 based on respective drive signals 114, 124. For example, the capacitive elements 112, 122 may be on-chip capacitors (e.g. implemented within metal layers or by trenches within a semiconductor substrate). However, the capacitive elements 112, 122 may also be any other suitable means for providing a capacitance. The capacitive elements 112, 122 may, e.g., exhibit a capacitance ranging from a few picofarad to a few attofarad.

Further, the DAC cells 110-1 and 120-1 comprise driver circuits 115, 125 (e.g. inverter circuits, buffer circuits or logic circuits) configured to generate the drive signals 114, 124 for the capacitive element 112, 122. In the example of FIG. 1, the driver circuits 115, 125 are implemented as buffer circuits. The driver circuits 115, 125 are supplied with a converter reference voltage $V_{SUPPLY}$ (e.g. 1 V) as provided by a voltage source 150 (e.g. a voltage regulator). For example, the converter reference voltage $V_{SUPPLY}$ may be a supply voltage for the DAC 100. The driver circuit 115 is configured to receive a first digital signal 101 representing digital data, and to output signal values corresponding to those of the first digital signal 101 in order to generate the drive signal 114. Similarly, the driver circuit 125 is configured to receive a second digital signal 102 representing inverted digital data, and to output signal values corresponding to those of the second digital signal 102 in order to generate the drive signal 124. Since the data represented by the first and second digital signals 101 and 102 are inverted with respect to each other, the resulting analog cell output signals of the DAC cells 110-1 and 120-1 are inverted with respect to each other.

The first analog signal is based on the analog cell output signals of the first plurality of DAC cells 110-1, . . . , 110-N, whereas the second analog signal is based on the analog cell output signals of the second plurality of DAC cells 120-1, . . . , 120-N. For example, the first plurality of DAC cells 110-1, . . . , 110-N may be coupled to a first common node so that their analog cell output signals sum up to the first analog signal. Similarly, the second plurality of DAC cells 120-1, . . . , 120-N may be coupled to a second common node so that their analog cell output signals sum up to the second analog signal. Since the analog cell output signals of the first plurality of DAC cells 110-1, . . . , 110-N are inverted with respect to the analog cell output signals of the second plurality of DAC cells 120-1, . . . , 120-N, the first analog signal 111 and the second analog signal 121 form a differential signal pair.

However, it is to be noted that the implementation of the DAC cells 110-1 and 120-1 as illustrated in FIG. 1 is merely exemplary. The DAC cells of the first plurality of DAC cells 110-1, . . . , 110-N and the second plurality of DAC cells 120-1, . . . , 120-N may in some examples be implemented different from what is illustrated in FIG. 1 (e.g. comprises more, less or other components and/or receive more, less or different signals). For example, the DAC cell 110-1 may receive a modulated oscillation signal instead of the first digital signal 101. In other examples, the DAC cell 110-1 may implemented like one of the DAC cells described below in connection with FIGS. 1 to 6.

The first plurality of DAC cells 110-1, . . . , 110-N and the second plurality of DAC cells 120-1, . . . , 120-N may be understood as a DAC core 105 since they provide the core functionality of the DAC 100.

The DAC 100 additionally comprises a transmission line transformer 130. A transmission line transformer may, in general, be understood as a RF transformer consisting of matched transmission lines exhibiting equal length and characteristic impedance (e.g. the transmission lines are wound around one or more cores made up of magnetic material). The transmission lines are coupled to each other in a predetermined manner defining the impedance transformation ratio of the transmission line transformer.

The transmission line transformer 130 comprises a first input node 131 coupled to the first plurality of DAC cells 110-1, . . . , 110-N, and a second input node 132 coupled to the second plurality of DAC cells 120-1, . . . , 120-N. Further, the transmission line transformer comprises a first output node 133 and a second output node 134. The transmission line transformer 130 is configured to present a first impedance at the first and second input nodes 131, 132 and to present a second impedance at the first and second output nodes 133, 134.

In the example of FIG. 1, the first output node 133 of the transmission line transformer 130 is coupled to an output node 106 of the DAC 100. The second output node 134 of the transmission line transformer 130 is coupled to another output node 107 of the DAC 100. The output nodes 133, 134 of the transmission line transformer 130 and the output nodes 106, 107 of the DAC 100 are illustrated as separate elements in FIG. 1. However, according to examples of the proposed technique, the output nodes 133, 134 of the transmission line transformer 130 and the output nodes 106, 107 of the DAC 100 may be identical. Terms such as "an output node of the transmission line transformer is coupled to an output node of the DAC" used within the present disclosure are meant to cover both cases.

A load 140 is coupled to the output nodes 106, 107 of the DAC 100. In the example of FIG. 1, the load 140 is illustrated as a resistor since any load presents an impedance to the DAC 100. For example, the load 140 may be a mixer for up-mixing the first analog signal 111 and/or the second analog signal 121, a Power Amplifier (PA) for amplifying the first analog signal 111 and/or the second analog signal 121, a filter for filtering the first analog signal 111 and/or the second analog signal 121, or an antenna for radiating the first analog signal 111 and/or the second analog signal 121 to the environment.

The transmission line transformer 130 forces the current at the two input nodes 131 and 132 to be equal (and in opposite phase), as well as the current at the two output nodes 133 and 134. Because the impedance levels at the input and output nodes are different, the voltages at input and output nodes are different (an ideal transformer is transparent for power if losses are neglected).

The transmission line transformer 130 exhibits a very broad frequency response so that the transmission line transformer 130 is a suitable very broadband matching network enabling impedance transformation from the DAC core 105 (i.e. the first and second DAC cells) to the load 140 coupled to the DAC 100. The transmission line transformer 130 may allow to present different impedances to the DAC core 105 and the load 140 at a very broad frequency response. For example, the first impedance presented at the first and second input nodes 131, 132 may be lower than the second impedance present at the first and second output nodes 133, 134. That is, a low first impedance may be presented to the DAC core 105 in order to maximize the output power of the DAC 100, whereas a predefined second impedance may be presented to the load 140.

In general, a ratio of the first impedance to the second impedance may be N:M, wherein N and M are real numbers with N<M. For example, a ratio of the first impedance to the second impedance may be 1:1.56, 1:2.25, 1:4, 1:9, 1:16, etc. In some examples, the first impedance may, hence, be at least four times lower than the second impedance.

The first plurality of DAC cells 110-1, . . . , 110-N is capable of generating the first analog signal 111 with a minimum signal frequency of less than a first frequency value and a maximum signal frequency of more than a second frequency value. The second frequency value may, e.g., be at least two, three, five, ten, or twenty times the first frequency value. For example, the first frequency value may between (in the order of) 500 MHz and 1 GHz, and the second frequency value may be 5 GHz or more (e.g. about 10 GHz).

Since the transmission line transformer 130 acts as a very wide bandwidth output matching network, the DAC 100 may, hence, allow direct RF synthesis for applications demanding a very wide output bandwidth. For example, Software-Defined-Radio (SDR) applications such as 5$^{th}$ Generation New Radio (5G NR) demand a very wide output bandwidth in the range of about 0.5 GHz to more than 5 GHz. In other words, SDR applications may cover more than a decade of signal bandwidth (i.e. the upper frequency limit of the used frequency range is more than ten times higher the lower limit). Since the transmission line transformer 130 exhibits a very broad frequency response with a suitable impedance transformation, the DAC 100 is capable of sub 1 GHz operation at the low end as well as of 5 to 10 GHz operation at the high end.

Since the transmission line transformer 130 is a very broadband matching network with suitable impedance transformation, the DAC 100 may be implemented as a fully integrated RF-CDAC for very wideband direct RF synthesis in an SDR application. For example, the DAC 100 may be used in a transmitter of a 5G NR base station or a 5G NR mobile device for direct synthesis of an RF output signal.

In some examples, the first plurality of DAC cells 110-1, . . . , 110-N (and optionally the second plurality of DAC cells 120-1, . . . , 120-N) and the transmission line transformer 130 may be integrated in a same semiconductor die (e.g. flip-chip package die; not illustrated in FIG. 1). In other words, the DAC core 105 and the transmission line transformer 130 may be integrated on-chip. The compactness of the DAC 100 may allow to integrate several RF-DACs on a single semiconductor die (chip) such that a transmitter array (e.g. for 5G NR beamforming applications) may be provided.

Alternatively, the first plurality of DAC cells 110-1, . . . , 110-N (and optionally the second plurality of DAC cells 120-1, . . . , 120-N) may be integrated in a semiconductor die of a semiconductor package and the transmission line transformer 130 may be formed on a Printed Circuit Board (PCB) holding the semiconductor package.

In the example of FIG. 1, the load 140 is coupled to both output nodes 133, 134 of the transmission line transformer 130 (e.g. via the output nodes 106, 107 of the DAC 100). In alternative examples, the load 140 (e.g. an antenna) may be coupled to only one of the output nodes 133, 134 of the transmission line transformer 130, whereas the other one of output nodes 133, 134 of the transmission line transformer 130 is coupled to ground. For example, the second output node 134 may be coupled to ground. The ground connection of the second output node 134 may be done on-chip, leading to only one output pin, or, alternatively, in package (still only one output pin for the packaged chip), or on the PCB (two output pins, only one used for signal transfer).

In the above description of FIG. 1, it is generally referred to a transmission line transformer. In the following, two DACs are described with reference to FIGS. 2 and 3 using a Guanella-type transmission line transformer. The Guanella-type transmission line transformer is an example for a transmission line transformer that may allow a broadband frequency response with a relatively wide range of impedance ratios.

Figure 2:
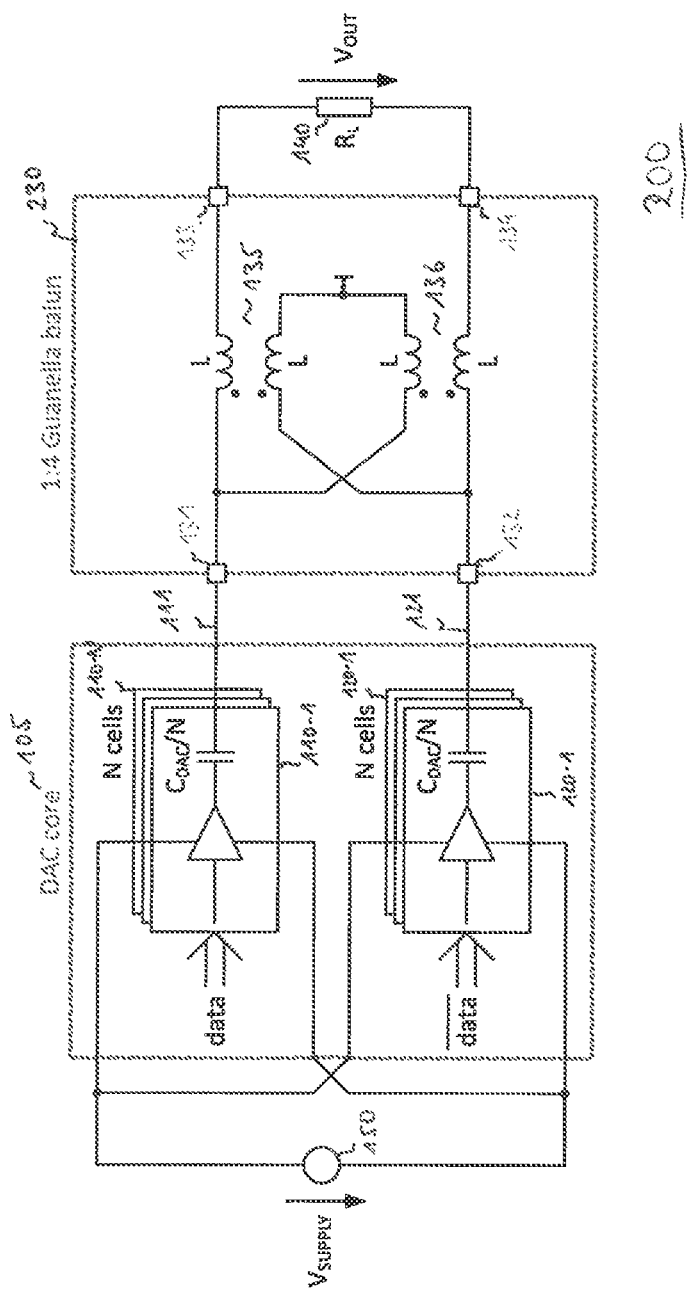
FIG. 2 illustrates a second example of a DAC.

FIG. 2 illustrates an exemplary DAC 200 using a Guanella-type transmission line transformer 230 with an impedance ratio of 1:4. That is, the first impedance that is presented to the DAC core 105 is four times lower than the second impedance presented to the load 140. Other than that, the DAC 200 is identical to DAC 100 illustrated in FIG. 1. The DAC 200 uses the Guanella-type transmission line transformer 230 as broadband matching network so that an integrated RF-CDAC may be provided.

The Guanella-type transmission line transformer 230 with intertwined inductor structures may be (easily) integrated on chip so that the first plurality of DAC cells 110-1, . . . , 110-N, the second plurality of DAC cells 120-1, . . . , 120-N and the Guanella-type transmission line transformer 230 may be integrated in a same semiconductor die. For example, the output side (indicated by output nodes 133 and 134) of the Guanella-type transmission line transformer 230 may be coupled to the load 140 via a semiconductor package holding the semiconductor die.

The two coupled inductor pairs 135, 136 of the Guanella-type transmission line transformer 230 form pairs of coupled transmission lines. In order to achieve the 1:4 impedance ratio, the pairs of coupled transmission lines are respectively coupled in parallel on the input side (indicated by input nodes 131 and 132) and in series on the output side.

For example, if an impedance of the load 140 is 100Ω, the Guanella-type transmission line transformer 230 presents a (differential) impedance of 25Ω to the DAC core 105. For example, for an integrated RF-CDAC in 1 V silicon technology, the Guanella-type transmission line transformer 230 with impedance ratio of 1:4 may be a good compromise between achievable output power and bandwidth (e.g. for very high bandwidth applications such as 5G NR).

Figure 3:
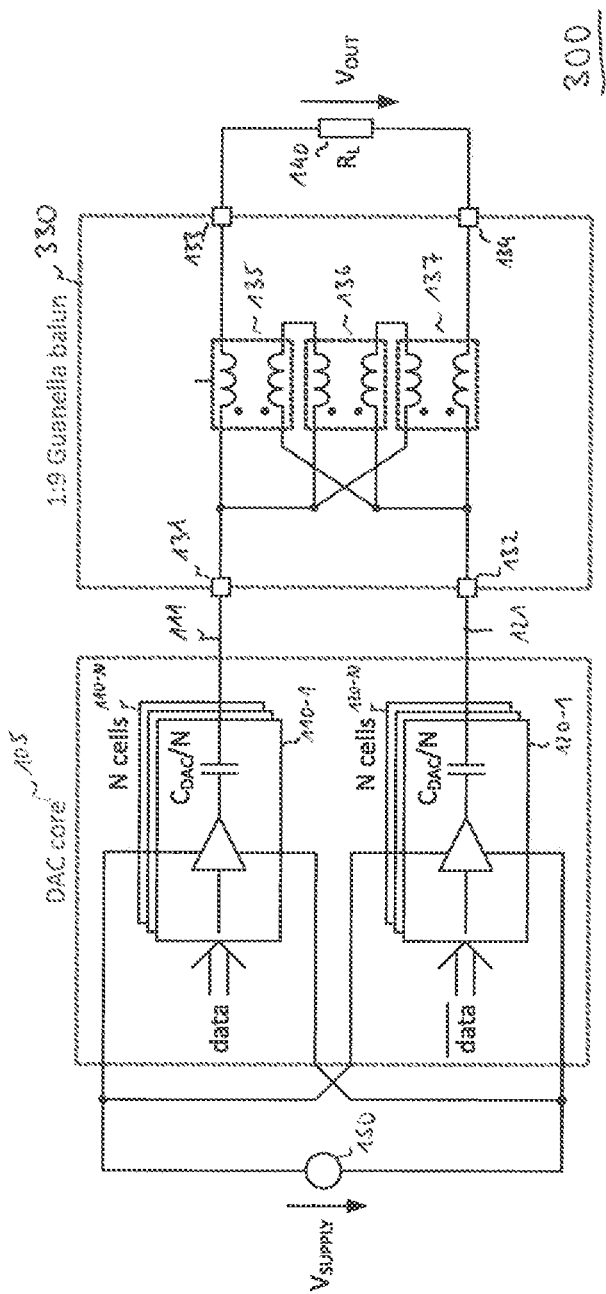
FIG. 3 illustrates a third example of a DAC.

FIG. 3 illustrates another exemplary DAC 300 using a Guanella-type transmission line transformer 330 with an impedance ratio of 1:9. That is, the first impedance that is presented to the DAC core 105 is nine times lower than the second impedance presented to the load 140. Other than that, the DAC 300 is identical to DACs 100 and 200 described above.

Compared to the Guanella-type transmission line transformer 230 of DAC 200, the Guanella-type transmission line transformer 330 used three coupled inductor pairs 135, 136 and 137 instead of only two pairs. Since three inductor pairs are now effectively coupled in parallel on the input side (indicated by input nodes 131 and 132), the Guanella-type transmission line transformer 330 provides a higher impedance ratio compared to the Guanella-type transmission line transformer 230 of DAC 200.

Accordingly, the Guanella-type transmission line transformer 330 may present a lower impedance value to the DAC core 105 than the Guanella-type transmission line transformer 230 of DAC 200. As a consequence, the DAC 300 may exhibit a higher output power than the DAC 200.

Compared to DAC 200, the parallel coupling of three coupled inductor pairs 135, 136 and 137 instead of only two pairs shifts the lower cutoff frequency of the Guanella-type transmission line transformer upwards for the same inductance L of the inductors and the same capacitance $C_{DAC}$ of the CDAC. Therefore, DAC 200 is more suitable for applications demanding for lower frequency synthesis (e.g. less than 1 GHz for on-chip implementations).

Using four pairs of coupled inductor pairs (i.e. four transmission line systems) in parallel provides a Guanella-type transmission line transformer with an impedance ratio of 1:16. This may allow still higher output power for the trade-off of reduced bandwidth (in particular towards lower frequencies for the same capacitance $C_{DAC}$ of the CDAC).

In the examples of FIGS. 2 and 3, the transmission line transformer is implemented as Guanella-type transmission line transformer. However, the proposed architecture is not limited to Guanella-type transmission line transformers. In general any transmission line transformer may be used. For example, Ruthroff-type transmission line transformers may be used instead of the Guanella-type transmission line transformers 230, 330 in the above described DACs 200, 300.

Figure 4:
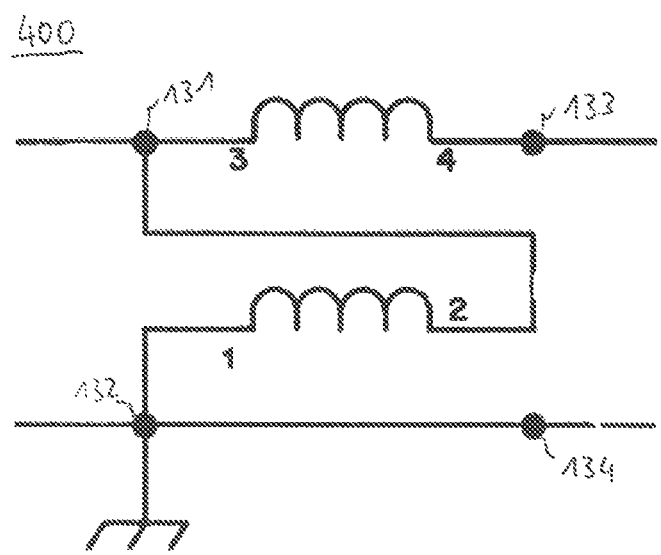
FIG. 4 illustrates a first example of a Ruthroff-type transmission line transformer.

A first example of a Ruthroff-type transmission line transformer 400 with an impedance ratio of 1:4 is illustrated in FIG. 4. Unlike the Guanella-type transmission line transformers, the Ruthroff-type transmission line transformer 400 exhibits a direct connection from the input to the output. The transmission lines of the Ruthroff-type transmission line transformer 400 are coiled forming chokes so that the transmission lines are raised by a voltage equal to the input, resulting in a voltage twice the input and, hence, a 1:4 impedance ratio. The characteristic impedance of the transmission line may, e.g., be equal to one-half of the load impedance $R_L$. This structure is also known as a "bootstrap".

Compared to the Ruthroff-type transmission line transformer 400, the Guanella-type transmission line transformer 230 exhibits a wider frequency response (i.e. a higher bandwidth).

Figure 5:
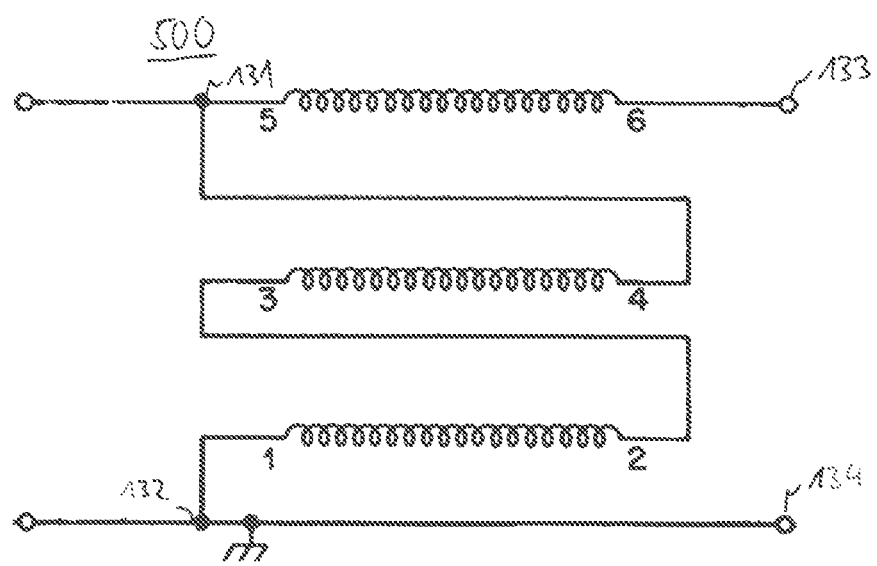
FIG. 5 illustrates a second example of a Ruthroff-type transmission line transformer.

An extension of the Ruthroff-type transmission line transformer 400 is illustrated in FIG. 5. FIG. 5 illustrates another Ruthroff-type transmission line transformer 500 with an impedance ratio of 1:2.25. The Ruthroff-type transmission line transformer 500 uses three inductors with one of the inductors connected to the input impedance.

Figure 6:
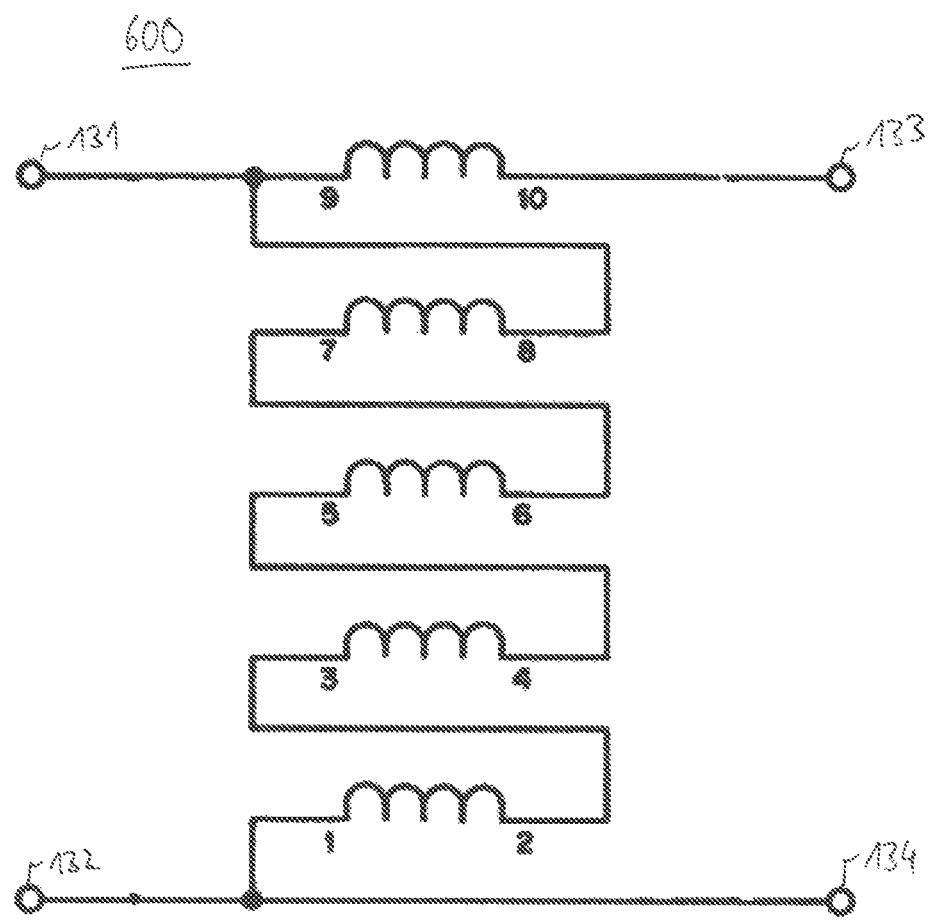
FIG. 6 illustrates a third example of a Ruthroff-type transmission line transformer.

Still another Ruthroff-type transmission line transformer 600 with an impedance ratio of 1:1.56 is illustrated in FIG. 6. In order to achieve the impedance ratio of 1:1.56, five inductors are used.

By decreasing the impedance ratio, a bandwidth of the Ruthroff-type transmission line transformers may be increased.

As indicated by means of the above examples, transmission line transformers with different impedance transformation ratios may be used to optimize the DAC (e.g. a CDAC) output bandwidth vs. the DAC output power trade-off for specific applications.

Figure 7:
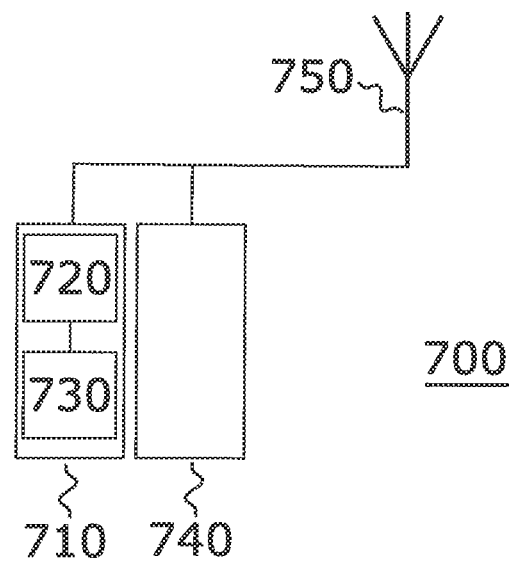
FIG. 7 illustrates an example of a base station.

An example of an implementation using a DAC according to one or more aspects of the architecture described above in connection with FIGS. 1 to 6 or one or more examples described above in connection with FIGS. 1 to 6 is illustrated in FIG. 7. FIG. 7 schematically illustrates an example of a radio base station 700 (e.g. for a femtocell, a picocell, a microcell or a macrocell) comprising a DAC 720 as proposed.

The DAC 720 is part of a transmitter 710. The transmitter 710 additionally comprises digital circuitry 730 (e.g. a Digital Signal Processor, DSP) configured to supply digital data as input to the DAC 720. For example, the digital circuitry 730 may be configured to generate the digital data based on data to be wirelessly transmitted.

Further, the base station 700 comprises at least one antenna element 750 coupled to the DAC 720 for radiating one or more RF transmit signals that are based on the DAC output to the environment. For example, the DAC 720 may be coupled to the antenna element 750 via one or more intermediate elements such as a filter, an up-converter (mixer) or a PA.

Additionally, the base station 700 comprises a receiver 740 configured to receive a RF receive signal from the antenna element 750 or another antenna element (not illustrated) of the base station 700.

To this end, a base station supporting direct RF synthesis at a very wide output bandwidth may be provided.

The base station 700 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 8:
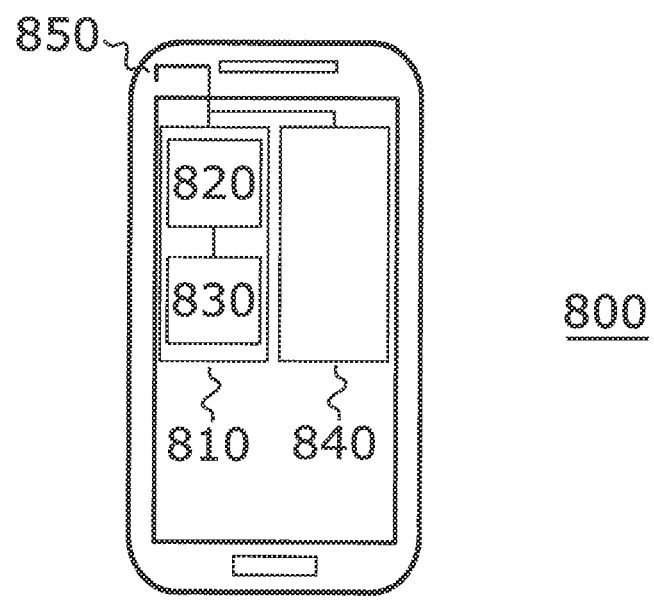
FIG. 8 illustrates an example of a mobile device.

Another example of an implementation using a DAC according to one or more aspects of the architecture described above in connection with FIGS. 1 to 6 or one or more examples described above in connection with FIGS. 1 to 6 is illustrated in FIG. 8. FIG. 8 schematically illustrates an example of a mobile device 800 (e.g. mobile phone, smartphone, tablet-computer, or laptop) comprising a DAC 820 as proposed.

The DAC 820 is part of a transmitter 810. The transmitter 810 additionally comprises digital circuitry 830 (e.g. a DSP) configured to supply digital data as input to the DAC 820. For example, the digital circuitry 830 may be configured to generate the digital data based on data to be wirelessly transmitted.

Further, the mobile device 800 comprises at least one antenna element 850 coupled to the DAC 820 for radiating one or more RF transmit signals that are based on the DAC output to the environment. For example, the DAC 820 may be coupled to the antenna element 850 via one or more intermediate elements such as a filter, an up-converter (mixer) or a PA.

Additionally, the mobile device 800 comprises a receiver 840 configured to receive a RF receive signal from the antenna element 850 or another antenna element (not illustrated) of the mobile device 800.

To this end, a mobile device supporting direct RF synthesis at a very wide output bandwidth may be provided.

The mobile device 800 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I$^2$C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using digital-to-analog conversion according to the proposed architecture or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WI-MAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is a DAC, comprising: a first plurality of DAC cells configured to generate a first analog signal; a second plurality of DAC cells configured to generate a second analog signal, wherein the first analog signal and the second analog signal form a differential signal pair; and a transmission line transformer comprising a first input node coupled to the first plurality of DAC cells, a second input node coupled to the second plurality of DAC cells, and a first output node, wherein the transmission line transformer is configured to present a first impedance at the first and second input nodes and to present a second impedance at the first output node.

Example 2 is the DAC of example 1, wherein the transmission line transformer is a Guanella-type transmission line transformer.

Example 3 is the DAC of example 1, wherein the transmission line transformer is a Ruthroff-type transmission line transformer.

Example 4 is the DAC of any of examples 1 to 3, wherein the first impedance is lower than the second impedance.

Example 5 is the DAC of example 4, wherein the first impedance is at least four times lower than the second impedance.

Example 6 is the DAC of any of examples 1 to 5, wherein the first plurality of DAC cells is capable of generating the first analog signal with a minimum signal frequency of less than a first frequency value and a maximum signal frequency of more than a second frequency value, the second frequency value being at least five times the first frequency value.

Example 7 is the DAC of example 6, wherein the first frequency value is between 500 MHz and 1 GHz, and wherein the second frequency value is 5 GHz or more.

Example 8 is the DAC of any of examples 1 to 7, wherein at least one of the first plurality of DAC cells comprises: a capacitive element configured to generate an analog cell output signal based on a drive signal, wherein the first analog signal is based on the analog cell output signal; and a driver circuit configured to generate the drive signal for the capacitive element.

Example 9 is the DAC of any of examples 1 to 8, wherein the first output node of the transmission line transformer is coupled to an output node of the DAC.

Example 10 is the DAC of any of examples 1 to 9, wherein the transmission line transformer further comprises a second output node coupled to another output node of the DAC.

Example 11 is the DAC of any of examples 1 to 10, wherein the transmission line transformer further comprises a second output node coupled to ground.

Example 12 is the DAC of any of examples 1 to 11, wherein the first plurality of DAC cells and the transmission line transformer are integrated in a same semiconductor die.

Example 13 is a transmitter, comprising: a DAC according to any of examples 1 to 12; and digital circuitry configured to supply digital data as input to the DAC.

Example 14 is the transmitter of example 13, wherein the digital circuitry is configured to generate the digital data based on data to be wirelessly transmitted.

Example 15 is a mobile device, comprising: a transmitter according to example 13 or example 14; and at least one antenna element coupled to the DAC.

Example 16 is the mobile device of example 15, further comprising a receiver configured to receive a radio frequency receive signal from the antenna element.

Example 17 is a base station, comprising: a transmitter according to example 13 or example 14; and at least one antenna element coupled to the DAC.

Example 18 is the base station of example 17, further comprising a receiver configured to receive a radio frequency receive signal from the antenna element.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . ." performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digital-to-analog converter, comprising:
   a digital-to-analog converter core comprising:
      one or more first digital-to-analog converter cells configured to generate a first analog signal,
         wherein the one or more first digital-to-analog converter cells is capable of generating the first analog signal with a minimum signal frequency of less than a first frequency value and a maximum signal frequency of more than a second frequency value,
         wherein the first frequency value is between 500 MHz and 1 GHz, and
         wherein the second frequency value is 5 GHz or more; and
      one or more second digital-to-analog converter cells configured to generate a second analog signal, wherein the first analog signal and the second analog signal form a differential signal pair; and
   a transmission line transformer coupled to the digital-to-analog converter and an output node of the digital-to-analog converter,
      wherein the transmission line transformer is configured to perform an impedance transformation along the digital-to-analog converter core and the output node of the digital-to-analog converter,
      wherein an impedance provided to the digital-to-analog converter core by the transmission line transformer is at least four times lower than an impedance provided by the transmission line transformer to the output node of the digital-to-analog converter.

2. The digital-to-analog converter of claim 1, wherein the transmission line transformer is a Guanella-type transmission line transformer.

3. The digital-to-analog converter of claim 1, wherein the transmission line transformer is a Ruthroff-type transmission line transformer.

4. The digital-to-analog converter of claim 1, wherein at least one of the one or more first digital-to-analog converter cells comprises:
   a capacitive element configured to generate an analog cell output signal based on a drive signal, wherein the first analog signal is based on the analog cell output signal; and
   a driver circuit configured to generate the drive signal for the capacitive element.

5. The digital-to-analog converter of claim 1, wherein the transmission line transformer comprises a first input node coupled to the one or more first digital-to-analog converter cells, a second input node coupled to the one or more second digital-to-analog converter cells, and a first output node coupled to the output node of the digital-to-analog converter.

6. The digital-to-analog converter of claim 5, wherein the transmission line transformer further comprises a second output node coupled to another output node of the digital-to-analog converter, wherein the transmission line transformer is further configured to perform impedance transformation between the DAC core and the other output node of the digital-to-analog converter.

7. The digital-to-analog converter of claim 5, wherein the transmission line transformer further comprises a second output node coupled to ground.

8. The digital-to-analog converter of claim 1, wherein the one or more first digital-to-analog converter cells and the transmission line transformer are integrated in a same semiconductor die.

9. A transmitter, comprising:
   a digital-to-analog converter according to claim 1; and
   digital circuitry configured to supply digital data as input to the digital-to-analog converter.

10. The transmitter of claim 9, wherein the digital circuitry is configured to generate the digital data based on data to be wirelessly transmitted.

11. A mobile device, comprising:
    a transmitter according to claim 9; and
    at least one antenna element coupled to the digital-to-analog converter.

12. The mobile device of claim 11, further comprising a receiver configured to receive a radio frequency receive signal from the antenna element.

13. A base station, comprising:
    a transmitter according to claim 9; and
    at least one antenna element coupled to the digital-to-analog converter.

14. The base station of claim 13, further comprising a receiver configured to receive a radio frequency receive signal from the antenna element.

* * * * *